(12) United States Patent
Narayan et al.

(10) Patent No.: US 9,148,166 B2
(45) Date of Patent: Sep. 29, 2015

(54) ADDING PREDEFINED OFFSET TO COARSE ADC RESIDUE OUTPUT TO SAR

(71) Applicant: Texas Instruments Incorporated, Dallas, TX (US)

(72) Inventors: Subramanian Jagdish Narayan, Bangalore (IN); Anand Kannan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/255,269

(22) Filed: Apr. 17, 2014

(65) Prior Publication Data

US 2015/0188561 A1 Jul. 2, 2015

Related U.S. Application Data

(60) Provisional application No. 61/922,487, filed on Dec. 31, 2013.

(51) Int. Cl.
*H03M 1/06* (2006.01)
*H03M 1/38* (2006.01)
*H03M 1/66* (2006.01)

(52) U.S. Cl.
CPC ........ *H03M 1/38* (2013.01); *H03M 1/06* (2013.01); *H03M 1/66* (2013.01)

(58) Field of Classification Search
CPC ......... H03M 1/804; H03M 1/46; H03M 1/00; H03M 2201/2291; H03M 2201/3178; G06F 3/044
USPC .......... 341/118, 155, 156, 150, 172, 161–163
See application file for complete search history.

(56) References Cited

U.S. PATENT DOCUMENTS

| | | | | |
|---|---|---|---|---|
| 5,621,409 A * | 4/1997 | Cotter et al. | ................. | 341/156 |
| 7,439,898 B1 * | 10/2008 | Nittala et al. | ................. | 341/163 |
| 7,944,379 B2 * | 5/2011 | Ohnhaeuser et al. | ......... | 341/118 |
| 8,031,099 B2 * | 10/2011 | Zhao et al. | ................... | 341/150 |
| 8,284,093 B2 * | 10/2012 | Kawai | ............................ | 341/172 |
| 8,547,270 B1 * | 10/2013 | Strode | ........................... | 341/161 |
| 2008/0143576 A1 * | 6/2008 | Chen et al. | .................... | 341/162 |
| 2010/0207791 A1 * | 8/2010 | Ohnhaeuser et al. | ......... | 341/118 |
| 2011/0148675 A1 * | 6/2011 | Zhao et al. | .................... | 341/118 |
| 2013/0044015 A1 * | 2/2013 | Reinhold et al. | ............. | 341/110 |
| 2013/0321189 A1 * | 12/2013 | Yoshioka et al. | ............. | 341/156 |

FOREIGN PATENT DOCUMENTS

WO 2009134734 A1 11/2009
WO 2011063203 A1 5/2011

* cited by examiner

*Primary Examiner* — Jean B Jeanglaude
(74) *Attorney, Agent, or Firm* — Lawrence J. Bassuk; Charles A. Brill; Frank D. Cimino

(57) ABSTRACT

A successive approximation register analog to digital converter (SAR ADC) receives an input voltage and a plurality of reference voltages. The SAR ADC includes a charge sharing DAC. The charge sharing DAC includes an array of MSB (most significant bit) capacitors and an array of LSB (least significant bit) capacitors. A zero crossing detector is coupled to the charge sharing DAC. The zero crossing detector generates a digital output. A coarse ADC (analog to digital converter) receives the input voltage and generates a coarse output. A predefined offset is added to a residue of the coarse ADC. A successive approximation register (SAR) state machine is coupled to the coarse ADC and the zero crossing detector and, generates a plurality of control signals. The plurality of control signals operates the charge sharing DAC in a sampling mode, an error-correction mode and a conversion mode.

20 Claims, 3 Drawing Sheets

ADDING PREDEFINED OFFSET TO COARSE ADC RESIDUE OUTPUT TO SAR

TECHNICAL FIELD

Embodiments of the disclosure relate generally to a successive approximation register analog to digital converter (SAR ADC) and more particularly to implementing a combination of a coarse ADC (analog to digital converter) and the SAR ADC.

BACKGROUND

A pipeline ADC (analog to digital converter) is generally preferred to achieve a speed of 100 MSPS (mega samples per second) in high speed applications. However in recent years, with the advent of UDSM (ultra deep sub micron) technologies and improved capacitor matching techniques, Successive approximation register analog to digital converter (SAR ADC) is a fast emerging alternative to the pipeline ADCs. The fact that pipelined ADCs require active amplifiers which comes at the cost of high power makes SAR ADCs a good architectural choice as its static power requirement is limited to a comparator which consumes a low power. The other type of power consumption in SAR ADCs is switching power consumption or dynamic power consumption. The switching power consumption is directly proportional to voltage, frequency and capacitance of the SAR ADC. If the frequency of the SAR ADC is reduced, it proportionately reduces the switching power consumption in the SAR ADC. A digital value stored in an n-bit successive approximation register (SAR) is input to a digital-to-analog converter, and a decision is made as to whether the value in the SAR represents an analog voltage that is higher or lower than an input analog value.

In an N-bit SAR ADC, the analog to digital conversion is done serially and hence requires N steps. Thus, a SAR ADC seeking to produce a 10 bit output has to perform 10 bit trials. Therefore, the SAR ADCs are inherently slow. In high speed applications, for example application at 100 MSPS throughput with 10 bit resolution, the SAR ADC is required to operate at 1 GHz. The SAR ADCs require one to two error correction cycles which further pushes the speed of operation and hence increase the dynamic power consumption in the SAR ADC. To resolve this issue, a coarse ADC or a flash ADC is used to resolve first few bits corresponding to the input analog value and then a SAR ADC is used to further resolve an output of the coarse ADC to a fine level. The resolution of first few bits by a coarse ADC relaxes the high speed requirements of a SAR ADC thereby reducing the dynamic power consumption. The coarse ADC is a fast ADC as it includes a plurality of comparators which are used to quickly resolve few bits of the N bit SAR ADC. However, a coarse ADC cannot be used for higher resolution as it would directly increase the number of comparators which will impact the area and power margins severely. Therefore, a combination of coarse ADC and SAR ADC is used for effective analog to digital conversion. For example, in a 10 bit SAR ADC, a coarse ADC is used to resolve first 2 bits (4 comparators) or first 3 bits (8 comparators). However, there are inherent problems in combining the coarse ADC and the SAR ADC.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An embodiment provides a successive approximation register analog to digital converter (SAR ADC) that receives an input voltage and a plurality of reference voltages. The SAR ADC includes a charge sharing DAC. The charge sharing DAC includes an array of MSB (most significant bit) capacitors and an array of LSB (least significant bit) capacitors. A zero crossing detector is coupled to the charge sharing DAC. The zero crossing detector generates a digital output. A coarse ADC (analog to digital converter) receives the input voltage and generates a coarse output. A predefined offset is added to a residue of the coarse ADC. A successive approximation register (SAR) state machine is coupled to the coarse ADC and the zero crossing detector and, generates a plurality of control signals. The plurality of control signals operates the charge sharing DAC in a sampling mode, an error-correction mode and a conversion mode.

Another embodiment provides a method of converting an input voltage to a digital output in a SAR ADC (successive approximation register analog to digital converter). The method provides generating a coarse output in a coarse ADC (analog to digital converter) from the input voltage. A predefined offset is added to a residue of the coarse ADC. An array of LSB capacitors is coupled to a negative reference voltage. A first set of capacitors of the array of MSB capacitors is coupled to a positive reference voltage in response to the coarse output and remaining capacitors of the array of MSB capacitors are coupled to the negative reference voltage in response to the coarse output. The input voltage is compared to a weighted voltage; the weighted voltage is the voltage across the array of MSB capacitors and the array of LSB capacitors. The digital output is generated in response to the comparison of the input voltage and the weighted voltage. A plurality of control signals is generated to couple a second set of capacitors of the array of MSB capacitors to the positive reference voltage in response to the digital output and to couple remaining capacitors of the array of MSB capacitors to the negative reference voltage in response to the digital output.

Other aspects and example embodiments are provided in the Drawings and the Detailed Description that follows.

BRIEF DESCRIPTION OF THE VIEWS OF DRAWINGS

Figure 3:
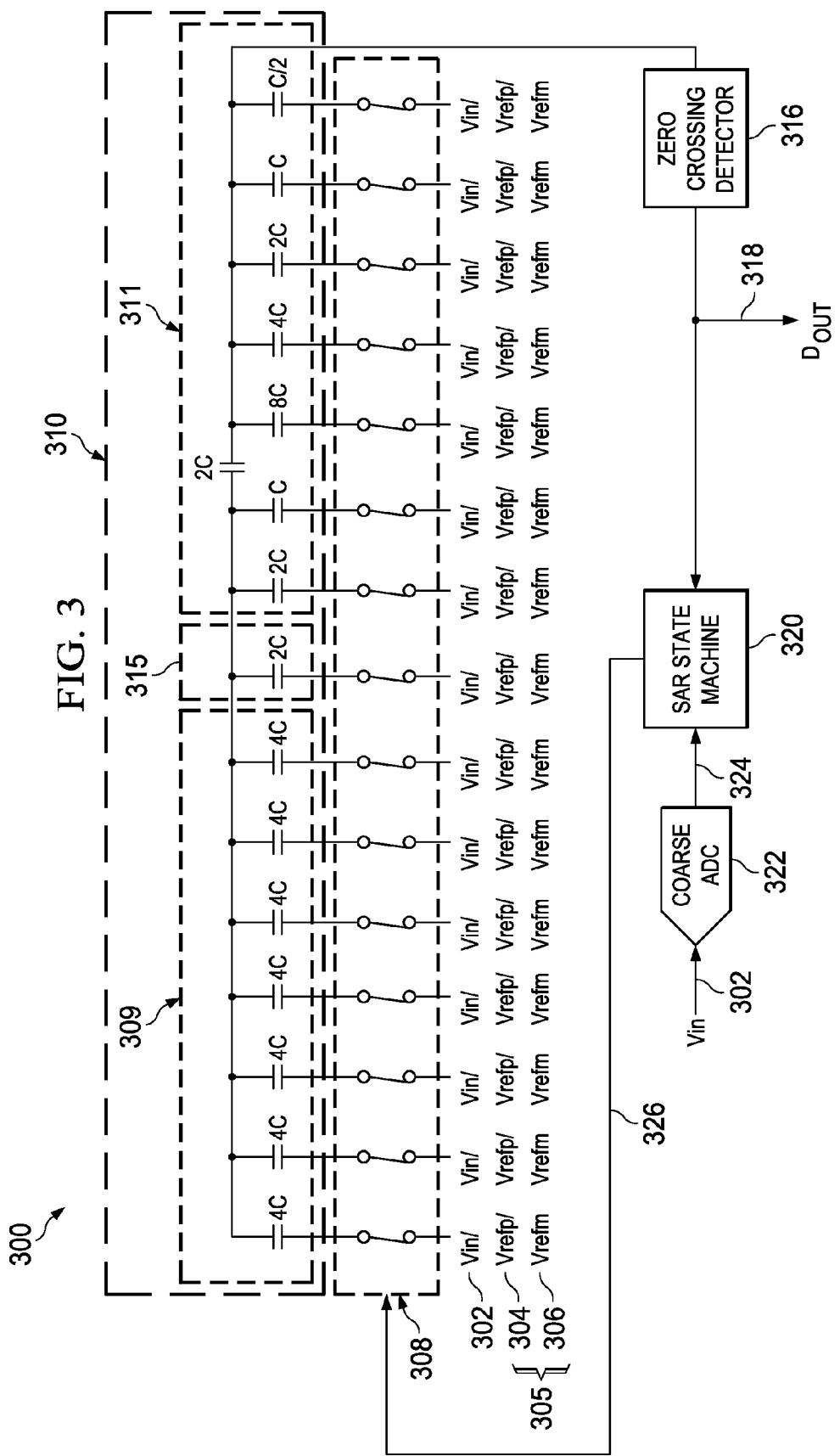
Figure 4:
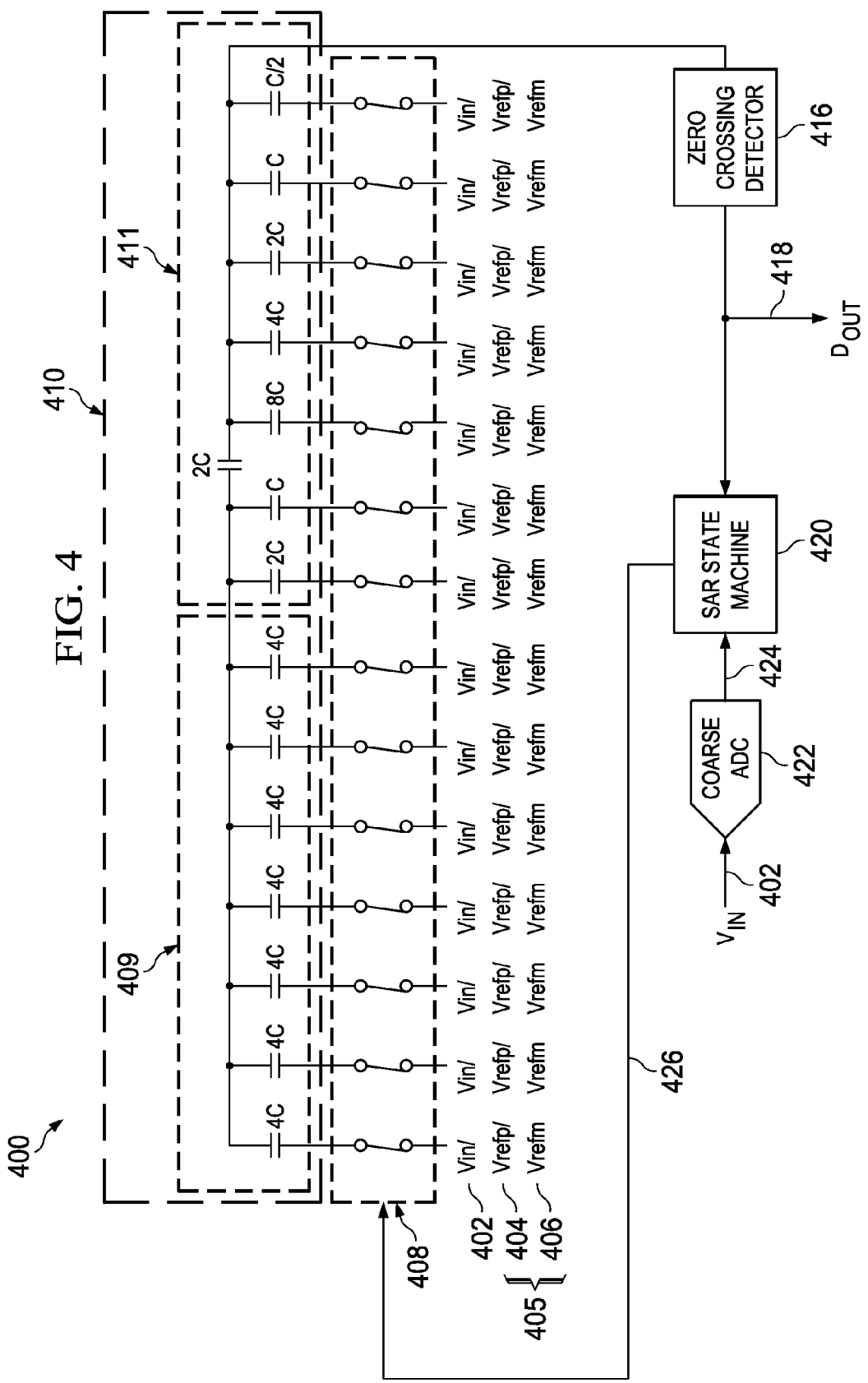

FIG. 3 a schematic of a Successive approximation register analog to digital converter (SAR ADC); and FIG. 4 illustrates a schematic of a Successive approximation register analog to digital converter (SAR ADC), according to an embodiment.

DETAILED DESCRIPTION OF THE EMBODIMENTS

Figure 1:
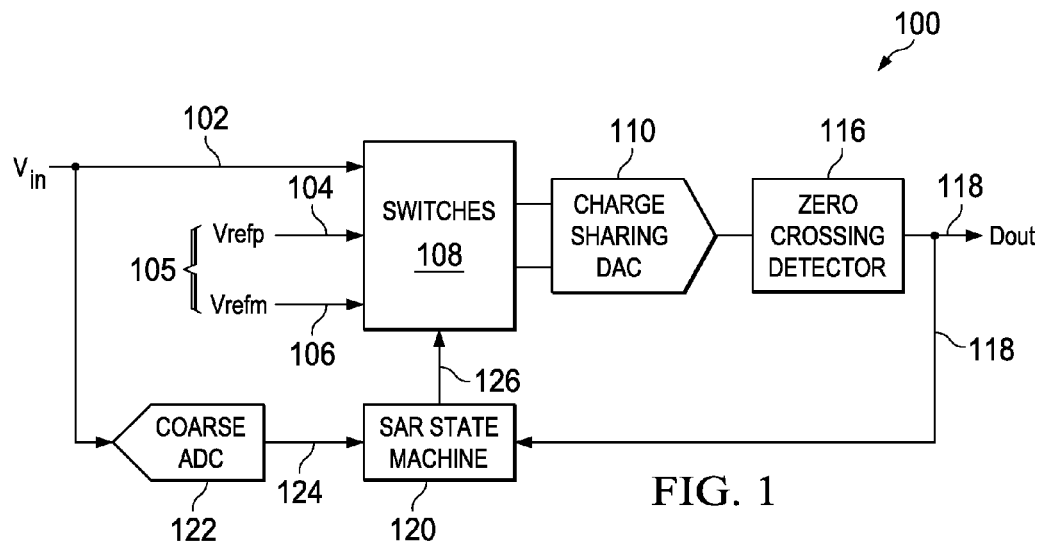
FIG. 1 illustrates a block diagram of a Successive approximation register analog to digital converter (SAR ADC), according to an example scenario.

FIG. 1 illustrates a block diagram of a Successive approximation register analog to digital converter (SAR ADC) 100, according to an example scenario. The SAR ADC 100 is one of a single-ended SAR ADC and a differential SAR ADC. The SAR ADC 100 includes a plurality of switches 108. Each switch of the plurality of switches 108 is configured to receive an input voltage Vin 102 and a set of reference voltages 105. The set of reference voltages includes a positive reference voltage Vrefp 104 and a negative reference voltage Vrefm 106. A charge sharing DAC (digital to analog converter) 110 is coupled to the plurality of switches 108. The charge sharing DAC 110 is coupled to a zero crossing detector 116. A common-mode voltage is used for DC biasing of the zero crossing detector 116. The common-mode voltage is a DC (direct current) voltage for defining the common-mode of the zero crossing detector 116. The. The zero crossing detector 116 is configured to generate a digital output (Dout) 118. A coarse ADC (analog to digital converter) 122 is configured to receive the input voltage Vin 102 and generate a coarse output 124. A successive approximation register (SAR) state machine 120 is coupled to the coarse ADC 122 and the zero crossing detector 116. The SAR state machine 120 generates a plurality of control signals 126. The plurality of switches 108 receives the plurality of control signals 126.

The operation of the SAR ADC 100 illustrated in FIG. 1 is explained now. The charge sharing DAC 110 includes an array of capacitors (not illustrated in FIG. 1). The SAR state machine 120 generates the plurality of control signals 126 which controls the array of capacitors in the charge sharing DAC 110. The plurality of control signals 126 operate the charge sharing DAC 110 in a sampling mode and a conversion mode. During the sampling mode, the array of capacitors are coupled to the zero crossing detector 116 and also coupled to the input voltage Vin 102. Thus, a voltage Vin is stored across the charge sharing DAC 110. The coarse ADC 122 generates a coarse output 124 in response to the input voltage Vin 102. The coarse output 124 is a coarse estimate of the input voltage Vin 102. The coarse output 124 is a multi-bit signal that corresponds to one of the several voltage bands in which the input voltage Vin 102 is likely to reside. The SAR state machine 120 couples a first set of capacitors of the array of capacitors to the positive reference voltage Vrefp 104 in response to the coarse output 124 while the remaining capacitors of the array of capacitors are coupled to the negative reference voltage Vrefm 106. Thus, a residue voltage Vres=(Vin−Vdac) is stored across the charge sharing DAC, where Vdac is a weighted voltage developed across the array of capacitors when coupled to the positive reference voltage Vrefp 104 and to the negative reference voltage Vrefm 106.

The zero crossing detector 116 compares the input voltage Vin 102 and the weighted voltage Vdac. The zero crossing detector 116 generates the digital output (bout) 118 in response to the comparison of the input voltage Vin 102 and the weighted voltage Vdac. In one example scenario, the zero crossing detector 116 generates a positive digital output when Vin is greater than Vdac and a negative digital output when Vin is less than Vdac. In one example scenario, the zero crossing detector 116 generates a negative digital output when Vin is greater than Vdac and a positive digital output when Vin is less than Vdac. In another example scenario, the zero crossing detector 116 compares the residue voltage Vres to a threshold voltage and generates a positive digital output when the residue voltage Vres is above the threshold voltage and a negative digital output when the residue voltage Vres is below the threshold voltage. In an example scenario, the zero crossing detector 116 compares the residue voltage Vres to a threshold voltage and generates a negative digital output when the residue voltage Vres is above the threshold voltage and a positive digital output when the residue voltage Vres is below the threshold voltage. The SAR state machine 120 couples a second set of capacitors of the array of capacitors to the positive reference voltage Vrefp 104 in response to the digital output (Dout) 118 while the remaining capacitors of the array of capacitors are coupled to the negative reference voltage Vrefm 106. In one scenario, the number of capacitors in second set is more than the number of capacitors in the first set when a digital output is received. In another scenario, the number of capacitors in second set is less than the number of capacitors in the first set when a digital output is received. A residue voltage Vres2=(Vin−Vdac2) is stored across the charge sharing DAC, where Vdac2 is a weighted voltage developed across the array of capacitors when coupled to the positive reference voltage Vrefp 104 and to the negative reference voltage Vrefm 106. During conversion mode, the zero crossing detector 116 compares the input voltage Vin 102 and the weighted voltage Vdac2. The zero crossing detector 116 generates the digital output (Dout) 118 in response to the comparison of the input voltage Vin 102 and the weighted voltage Vdac2. The SAR ADC 100 performs a search and the search is terminated when the digital output (Dout) 118 is within a quantization error. The quantization error is defined as (Vrefp−Vrefm)/$2^N$ for an N-bit SAR ADC. In one scenario, the quantization error is a predefined fraction of (Vrefp−Vrefm) for a SAR ADC. In the search, the SAR state machine 120 couples a set of capacitors of the array of capacitors to the positive reference voltage Vrefp 104 in response to the digital output (Dout) 118. Further, the zero crossing detector 116 compares the input voltage Vin 102 and the weighted voltage and generates the digital output in response to the comparison of the input voltage Vin 102 and the weighted voltage.

Figure 2:
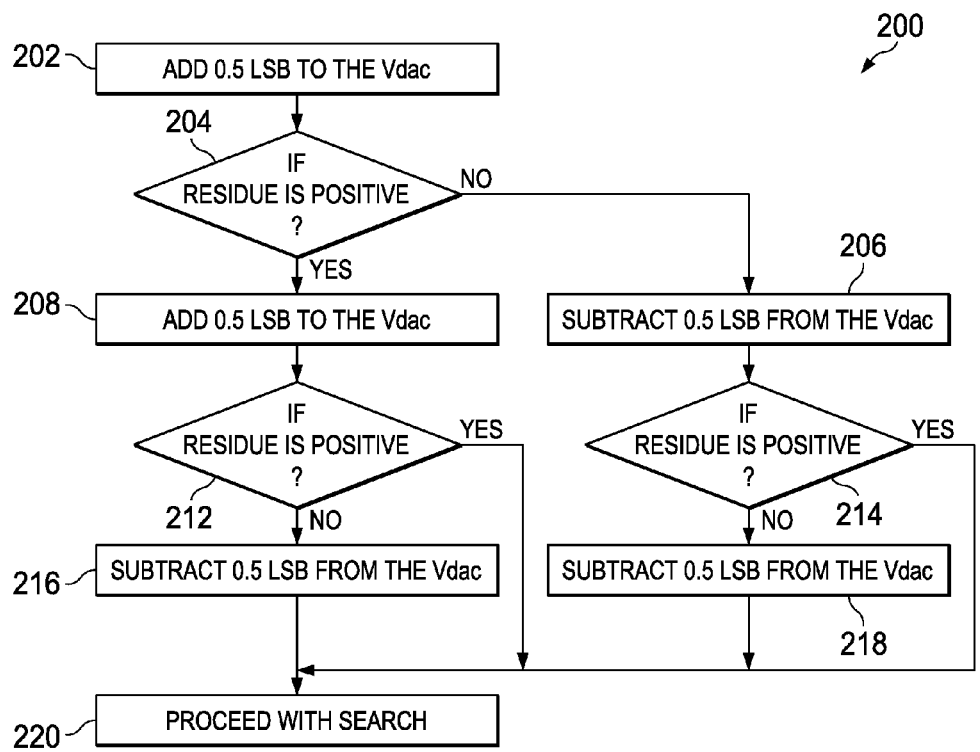
FIG. 2 is a flowchart illustrating a method of reducing a residue voltage (Vres) in a Successive approximation register analog to digital converter (SAR ADC)

FIG. 2 is a flowchart 200 illustrating a method of reducing a residue voltage (Vres) in a Successive approximation register analog to digital converter (SAR ADC), for example SAR ADC 100. For the purpose of illustration and not for the purpose of limitation, the flowchart 200 is explained with the help of SAR ADC 100. An ideal K-bit coarse ADC will resolve the input voltage Vin 102 to K bit with a residue of 0LSB to 1LSB of K bit. A K-bit coarse ADC will result in a quantization error of (Vrefp−Vrefm)/$2^K$. For example, a 3 bit coarse ADC will result in the quantization error of (Vrefp−Vrefm)/8. In other words, the K-bit coarse ADC generates a residue voltage of 0 mV (mili-volt) to 125 mV when Vrefp is equal to 1 volt, which corresponds to a residue of 0LSB to 1LSB of K bit. However, errors occurring within the coarse ADC such as zero crossing detector mismatches, excessive delay in signal paths impact the residue of a coarse ADC. Therefore, a K-bit coarse ADC will resolve the input voltage Vin 102 to K bit with a residue of −0.5LSB to 1.5LSB of K bit, which corresponds to a residue voltage of −62.5 mV to 187.5 mV when Vrefp is equal to 1 volt. The flowchart 200 illustrates a method of resolving the residue of −0.5LSB to 1.5LSB of K bit to 0LSB to 0.5LSB of K bit in a system. Thus, the flowchart 200 represents an error-correction mode in a SAR ADC. The residue can lie in the range of −0.5LSB to 0LSB or 0LSB to 0.5LSB or 0.5LSB to 1LSB or 1LSB to 1.5LSB. For the purpose of illustration and not for the purpose of limitation, the coarse ADC 122 is a K-bit coarse ADC with a residue of M LSB of K bit. Also, the residue voltage is given as:

$$Vres = Vin - Vdac \tag{1}$$

Vin is the input voltage and Vdac is a weighted voltage developed from application of the positive reference voltage Vrefp 104 and the negative reference voltage Vrefm 106 to the charge sharing DAC 110. At step 202, 0.5LSB is added to the Vdac, which results in:

$$Vres = Vin - (Vdac + 0.5LSB) \tag{2}$$

$$Vres = Vin - Vdac - 0.5LSB \tag{3}$$

Equation 3 illustrates that the 0.5LSB gets subtracted to obtain the residue voltage Vres. Thus, the residue of the K-bit coarse ADC becomes (M−0.5)LSB. This residue is analyzed in decision block 204. If the residue i.e. (M−0.5) LSB is positive, the system proceeds to step 208 otherwise the system proceeds to step 206. At step 208, 0.5LSB is added to the Vdac, which results in:

$$Vres=Vin-(Vdac+0.5LSB)-0.5LSB \quad (4)$$

$$Vres=Vin-Vdac-1LSB \quad (5)$$

Equation 5 illustrates that the 0.5LSB gets subtracted to obtain the residue voltage Vres. Thus, the residue of the K-bit coarse ADC becomes (M−1)LSB. This residue is analyzed in decision block 212. If the residue i.e. (M−1) LSB is positive, the system proceeds to step 220 otherwise the system proceeds to step 216. At step 216, 0.5LSB is subtracted from the Vdac, which results in:

$$Vres=Vin-(Vdac-0.5LSB)-1LSB \quad (6)$$

$$Vres=Vin-Vdac-0.5LSB \quad (7)$$

Equation 7 illustrates that the 0.5LSB gets added to obtain the residue voltage Vres. Thus, the residue of the K-bit coarse ADC becomes (M−0.5)LSB. This residue would have a value in-between the desired range of 0LSB to 0.5LSB of K bit. The system then proceeds to step 220.

At step 206, 0.5LSB is subtracted from the Vdac, which results in:

$$Vres=Vin-(Vdac-0.5LSB)-0.5LSB \quad (8)$$

$$Vres=Vin-Vdac \quad (8)$$

Equation 9 illustrates that the 0.5LSB gets added to obtain the residue voltage Vres. Thus, the residue of the K-bit coarse ADC becomes M LSB. This residue is analyzed in decision block 214. If the residue i.e. M LSB is positive, the system proceeds to step 220 otherwise the system proceeds to step 218. At step 218, 0.5LSB is subtracted from the Vdac, which results in:

$$Vres=Vin-(Vdac-0.5LSB) \quad (10)$$

$$Vres=Vin-Vdac+0.5LSB \quad (11)$$

Equation 11 illustrates that the 0.5LSB gets added to obtain the residue voltage Vres. Thus, the residue of the K-bit coarse ADC becomes (M+0.5)LSB. This residue would have a value in-between the desired range of 0LSB to 0.5LSB of K bit. The system then proceeds to step 220. At step 220, the system proceeds with search in the SAR ADC 100. It is understood that the additions and subtractions in the flowchart 200 can be performed in analog domain as well i.e. instead of 0.5LSB; a voltage of 125 mV is subtracted or added to obtain the residue voltage. The SAR ADC 100 may continue to operate in error-correction mode till the residue is within a predefined range i.e. the steps from 202 to 218 or steps from 202 to 216 are repeated till the residue is within the predefined range.

The flowchart 200 is now explained with the help of two examples. In the first example, we consider the coarse ADC 122 is a K-bit coarse ADC with a residue of 1.25LSB of K bit. At step 202, the residue becomes (1.25−0.5)LSB i.e. 0.75LSB. Since, the obtained residue is positive (decision block 204), the system proceeds to step 208. At step 208, the residue becomes (0.75−0.5)LSB i.e. 0.25LSB. This residue is in-between the desired range of 0LSB to 0.5LSB of K bit. Since, the obtained residue is positive (decision block 212), the system proceeds to step 220. At step 220, the search is implemented in the SAR ADC 100.

In the second example, we consider the coarse ADC 122 is a K-bit coarse ADC with a residue of −0.25LSB of K bit. At step 202, the residue becomes (−0.25−0.5)LSB i.e. −0.75LSB. Since, the obtained residue is negative (decision block 204), the system proceeds to step 206. At step 206, the residue becomes (−0.75+0.5)LSB i.e. −0.25LSB. Since, the obtained residue is negative (decision block 214), the system proceeds to step 218. At step 218, the residue becomes (−0.25+0.5)LSB i.e. +0.25LSB. This residue is in-between the desired range of 0LSB to 0.5LSB of K bit. The system then proceeds to step 220. At step 220, the search is implemented in the SAR ADC 100.

The method of reducing the residue voltage (Vres) in the SAR ADC 100 illustrated in FIG. 2 increases the system complexity as adders and subtractors would be required for implementation. Further, it hampers the speed of operation of the SAR ADC 100 and is particularly not suited when SAR ADC 100 is used in high speed applications.

FIG. 3 illustrates a schematic of a Successive approximation register analog to digital converter (SAR ADC) 300, according to an example scenario. The SAR ADC 300 is one of a single-ended SAR ADC and a differential SAR ADC. The SAR ADC 300 includes a plurality of switches 308. Each switch of the plurality of switches 308 is configured to receive an input voltage Vin 302 and a set of reference voltages 305. The set of reference voltages includes a positive reference voltage Vrefp 304 and a negative reference voltage Vrefm 306. A charge sharing DAC (digital to analog converter) 310 is coupled to the plurality of switches 308. The charge sharing DAC 310 includes an array of MSB capacitors 309, an additional capacitor 315 and an array of LSB capacitors 311 coupled serially. The charge sharing DAC 310 is coupled to a zero crossing detector 316. A common-mode voltage is used for DC biasing of the zero crossing detector 316. The common-mode voltage is a DC (direct current) voltage for defining the common-mode of the zero crossing detector 316. The zero crossing detector 316 is configured to generate a digital output (Dout) 318. A coarse ADC (analog to digital converter) 322 is configured to receive the input voltage Vin 302 and generate a coarse output 324. A successive approximation register (SAR) state machine 320 is coupled to the coarse ADC 322 and the zero crossing detector 316. The SAR state machine 320 generates a plurality of control signals 326. The plurality of switches 308 receives the plurality of control signals 326. Each switch of the plurality of switches 308 is coupled to a capacitor in the array of MSB capacitors 309, the additional capacitor 315 and an array of LSB capacitors 311. Each switch of the plurality of switches 308 can also be coupled to one or more capacitors in the array of MSB capacitors 309, the additional capacitor 315 and the array of LSB capacitors 311. Also, each switch of the plurality of switches 308 receives a control signal of the plurality of control signals 326 from the SAR state machine 320.

The operation of the SAR ADC 300 illustrated in FIG. 3 is explained now. The SAR state machine 320 generates the plurality of control signals 326 which controls the array of MSB capacitors 309, the additional capacitor 315 and the array of LSB capacitors 311 in the charge sharing DAC 310. The plurality of control signals 326 operate the charge sharing DAC 310 in a sampling mode, an error correction mode and a conversion mode. During the sampling mode, top plates of the array of MSB capacitors 309, the additional capacitor 315 and the array of LSB capacitors 311 are coupled to the zero crossing detector 316 and bottom plates of the array of MSB capacitors 309, the additional capacitor 315 and the array of LSB capacitors 311 are coupled to the input voltage Vin 302. Thus, a voltage Vin is stored across the charge sharing DAC 310. In error correction mode, the bottom plates of the array of MSB capacitors 309, the additional capacitor 315 and the array of LSB capacitors 311 are coupled to the negative reference voltage Vrefm 306. The coarse ADC 322 generates a coarse output 324 in response to the input voltage Vin 302. The coarse output 324 is a coarse estimate of the input voltage Vin 302. The coarse output 324 is a multi-bit signal that corresponds to one of the several voltage bands in which the input voltage Vin 302 is likely to reside. The SAR state machine 320 couples bottom plates of a first set of capacitors of the array of MSB capacitors 309 and the additional capacitor 315 to the positive reference voltage Vrefp 304 in response to the coarse output 324 while the bottom plates of remaining capacitors of the array of MSB capacitors 309 and the array of LSB capacitors 311 are coupled to the negative reference voltage Vrefm 306. Thus, a residue voltage Vres=(Vin−Vdac) is stored across the charge sharing DAC, where Vdac is a weighted voltage developed across the array of MSB capacitors 309, the additional capacitor 315 and the array of LSB capacitors 311 when coupled to the positive reference voltage Vrefp 304 and the negative reference voltage Vrefm 306. The additional capacitor 315 introduces a permanent offset of 62.5 mV in the residue voltage Vres when Vrefp is equal to 1 volt, which corresponds to a residue of 0.5LSB of K bit in a K-bit SAR ADC.

The zero crossing detector 316 compares the input voltage Vin 302 and the weighted voltage Vdac. The zero crossing detector 316 generates the digital output (Dout) 318 in response to the comparison of the input voltage Vin 102 and the weighted voltage Vdac. The SAR state machine 320 couples bottom plates of a second set of capacitors of the array of MSB capacitors 309 to the positive reference voltage Vrefp 304 in response to the digital output 318 while the bottom plates of remaining capacitors of the array of MSB capacitors 309 and the array of LSB capacitors 311 are coupled to the negative reference voltage Vrefm 306. Thus, a residue voltage Vres2=(Vin−Vdac2) is stored across the charge sharing DAC, where Vdac2 is a weighted voltage developed across the array of MSB capacitors 309, the additional capacitor 315 and the array of LSB capacitors 311 when coupled to the positive reference voltage Vrefp 304 and the negative reference voltage Vrefm 306. During conversion mode, the zero crossing detector 316 compares the input voltage Vin 302 and the weighted voltage Vdac2. The zero crossing detector 316 generates the digital output (bout) 318 in response to the comparison of the input voltage Vin 302 and the weighted voltage Vdac2. The SAR ADC 300 performs a search and the search is terminated when the digital output (Dout) 318 is within a quantization error. The quantization error is defined as $(Vrefp-Vrefm)/2^N$ for an N-bit SAR ADC. In one scenario, the quantization error is a predefined fraction of (Vrefp−Vrefm) for a SAR ADC. In the search, the SAR state machine 320 couples a set of capacitors of the array of LSB capacitors 311 to the positive reference voltage Vrefp 304 in response to the digital output (Dout) 318 while the remaining capacitors of the array of LSB capacitors 311 are coupled to the negative reference voltage Vrefm 306. Further, the zero crossing detector 316 compares the input voltage Vin 302 and the weighted voltage and generates the digital output in response to the comparison of the input voltage Vin 302 and the weighted voltage.

An ideal K-bit coarse ADC will resolve the input voltage Vin 302 to K bit with a residue of 0LSB to 1LSB of K bit. A K-bit coarse ADC will result in a quantization error of Vrefp/$2^K$. For example, a 3 bit coarse ADC will result in the quantization error of Vrefp/8. In other words, the K-bit coarse ADC generates a residue voltage of 0 to 125 mV when Vrefp is equal to 1 volt, which corresponds to a residue of 0LSB to 1LSB of K bit. However, errors occurring within the coarse ADC such as zero crossing detector mismatches, excessive delay in signal paths impact the residue of a coarse ADC. Therefore, a K-bit coarse ADC will resolve the input voltage Vin 302 to K bit with a residue of −0.5LSB to 1.5LSB of K bit, which corresponds to a residue voltage of −62.5 mV to 187.5 mV when Vrefp is equal to 1 volt. The additional capacitor 315 provides an additional offset of 0.5LSB which moves the residue from −0.5LSB to 1.5LSB of K bit to −1LSB to 1LSB of K bit. The residue of −1LSB to 1LSB corresponds to a residue voltage of −125 mV to +125 mV, when Vrefp is equal to 1 volt. However, the additional capacitor 315 leads to second order artifacts because of mismatch between the additional capacitor 315 and the array of MSB capacitors 309 and the array of LSB capacitors 311. It is very difficult to integrate the additional capacitor 315 to the charge sharing DAC 310. This is extremely critical as any mismatch greater than 0.5LSB of K bit can cause linear errors which are very difficult of correct. Also, including the additional capacitor 315 in existing standard layout patterns is costly and time consuming. The additional capacitor 315 introduces a permanent offset in residue of 0.5LSB of K bit which corresponds to a residue voltage of 62.5 mV, when Vrefp is equal to 1 volt. This offset value is very high for a SAR ADC thus making it unusable for most high speed applications.

FIG. 4 illustrates a schematic of a Successive approximation register analog to digital converter (SAR ADC) 400, according to an embodiment. The SAR ADC 400 is one of a single-ended SAR ADC and a differential SAR ADC. The SAR ADC 400 includes a plurality of switches 408. Each switch of the plurality of switches 408 is configured to receive an input voltage Vin 402 and a set of reference voltages 405. The set of reference voltages 405 includes a positive reference voltage Vrefp 404 and a negative reference voltage Vrefm 406. A charge sharing DAC (digital to analog converter) 410 is coupled to the plurality of switches 408. The charge sharing DAC 410 includes an array of MSB capacitors 409 and an array of LSB capacitors 411 coupled serially. In an embodiment, the array of LSB capacitors 411 is not present in the charge sharing DAC 410. The charge sharing DAC 410 is coupled to a zero crossing detector 416. A common-mode voltage is used for DC biasing of the zero crossing detector 416. The common-mode voltage is a DC (direct current) voltage for defining the common-mode of the zero crossing detector 416. The zero crossing detector 416 is configured to generate a digital output (Dout) 418. A coarse ADC (analog to digital converter) 422 is configured to receive the input voltage Vin 402 and generate a coarse output 424. A successive approximation register (SAR) state machine 420 is coupled to the coarse ADC 422 and the zero crossing detector 416. The SAR state machine 420 generates a plurality of control signals 426. The plurality of switches 408 receives the plurality of control signals 426. Each switch of the plurality of switches 408 is coupled to a capacitor in the array of MSB capacitors 409 and an array of LSB capacitors 411. In one embodiment, each switch of the plurality of switches 408 is coupled to one or more capacitors in the array of MSB capacitors 409 and the array of LSB capacitors 411. Also, each switch of the plurality of switches 408 receives a control signal of the plurality of control signals 426 from the SAR state machine 420.

The operation of the SAR ADC 400 illustrated in FIG. 4 is explained now. The SAR state machine 420 generates the plurality of control signals 426 which controls the array of MSB capacitors 409 and the array of LSB capacitors 411 in the charge sharing DAC 410. The plurality of control signals 426 operate the charge sharing DAC 410 in a sampling mode, an error-correction mode and a conversion mode. During the sampling mode, top plates of the array of MSB capacitors 409 and the array of LSB capacitors 411 are coupled to the zero crossing detector 416 and bottom plates of the array of MSB capacitors 409 and the array of LSB capacitors 411 are coupled to the input voltage Vin 402. In an embodiment, bottom plates of the array of MSB capacitors 409 and the array of LSB capacitors 411 are coupled to the zero crossing detector 416 and top plates of the array of MSB capacitors 409 and the array of LSB capacitors 411 are coupled to the input voltage Vin 402. Thus, a voltage Vin is stored across the charge sharing DAC 410. In error-correction mode, the bottom plates of the array of MSB capacitors 409 and the array of LSB capacitors 411 are coupled to the negative reference voltage Vrefm 406. The coarse ADC 422 generates a coarse output 424 in response to the input voltage Vin 402. The coarse output 424 is a coarse estimate of the input voltage Vin 402. The coarse output 424 is a multi-bit signal that corresponds to one of the several voltage bands in which the input voltage Vin 402 is likely to reside. The SAR state machine 420 couples bottom plates of a first set of capacitors of the array of MSB capacitors 409 to the positive reference voltage Vrefp 404 in response to the coarse output 424 while the bottom plates of remaining capacitors of the array of MSB capacitors 409 and the array of LSB capacitors 411 are coupled to the negative reference voltage Vrefm 406. Thus, a residue voltage Vres=(Vin−Vdac) is stored across the charge sharing DAC, where Vdac is a weighted voltage developed across the array of MSB capacitors 409 and the array of LSB capacitors 411 when coupled to the positive reference voltage Vrefp 404 and the negative reference voltage Vrefm 406

The zero crossing detector 416 compares the input voltage Vin 402 and the weighted voltage Vdac. The zero crossing detector 416 generates the digital output (Dout) 418 in response to the comparison of the input voltage Vin 402 and the weighted voltage Vdac. In one embodiment, the zero crossing detector 416 generates a positive digital output when Vin is greater than Vdac and a negative digital output when Vin is less than Vdac. In one embodiment, the zero crossing detector 416 generates a negative digital output when Vin is greater than Vdac and a positive digital output when Vin is less than Vdac. In one embodiment, the zero crossing detector 416 compares the residue voltage Vres to a threshold voltage and generates a positive digital output when the residue voltage Vres is above a threshold voltage and a negative digital output when the residue voltage Vres is below the threshold voltage. In one embodiment, the zero crossing detector 416 compares the residue voltage Vres to a threshold voltage and generates a negative digital output when the residue voltage Vres is above the threshold voltage and a positive digital output when the residue voltage Vies is below the threshold voltage. The SAR state machine 420 couples bottom plates of a second set of capacitors of the array of MSB capacitors 409 to the positive reference voltage Vrefp 404 in response to the digital output 418 while the bottom plates of remaining capacitors of the array of MSB capacitors 409 and the array of LSB capacitors 411 are coupled to the negative reference voltage Vrefm 406. In one embodiment, the number of capacitors in the second set is more than the number of capacitors in the first set when a digital output (Dout) 418 is received. In another embodiment, the number of capacitors in second set is less than the number of capacitors in the first set when a digital output (Dout) 418 is received. Thus, a residue voltage Vres2=(Vin−Vdac2) is stored across the charge sharing DAC 410, where Vdac2 is a weighted voltage developed across the array of MSB capacitors 409 and the array of LSB capacitors 411 when coupled to the positive reference voltage Vrefp 404 and the negative reference voltage Vrefm 406. In one embodiment, the SAR ADC 400 continues to operate in error-correction mode till the residue is within a predefined range i.e. the SAR ADC 400 undergoes more than one cycle of coupling the MSB capacitors 409 to the positive reference voltage Vrefp 404 in response to the digital output 418.

During conversion mode, the zero crossing detector 416 compares the input voltage Vin 402 and the weighted voltage Vdac2. The zero crossing detector 416 generates the digital output (Dout) 418 in response to the comparison of the input voltage Vin 402 and the weighted voltage Vdac2. The SAR ADC 400 performs a search and the search is terminated when the digital output (Dout) 418 is within a quantization error. The quantization error is defined as $(Vrefp-Vrefm)/2^N$ for an N-bit SAR ADC. In one embodiment, the quantization error is a predefined fraction of (Vrefp−Vrefm) for a SAR ADC. In the search, the SAR state machine 420 couples a set of capacitors of the array of LSB capacitors 411 to the positive reference voltage Vrefp 404 in response to the digital output (Dout) 418. Further, the zero crossing detector 416 compares the input voltage Vin 402 and the weighted voltage and generates the digital output (Dout) 418 in response to the comparison of the input voltage Vin 402 and the weighted voltage. The quantization error is fixed in a SAR ADC 400. In one embodiment, the quantization error is defined by a user. In another embodiment, the quantization error is dynamically adjusted based on error profiles stored in SAR state machine 420.

An ideal K-bit coarse ADC will resolve the input voltage Vin 402 to K bit with a residue of 0LSB to 1LSB of K bit. A K-bit coarse ADC will result in a quantization error of Vrefp/$2^K$. For example, a 3 bit coarse ADC will result in the quantization error of Vrefp/8. In other words, the K-bit coarse ADC generates a residue voltage of 0 to 125 mV when Vrefp is equal to 1 volt, which corresponds to a residue of 0LSB to 1LSB of K bit. However, errors occurring within the coarse ADC such as zero crossing detector mismatches, excessive delay in signal paths impact the residue of a coarse ADC. Therefore, a K-bit coarse ADC will resolve the input voltage Vin 402 to K bit with a residue of −0.5LSB to 1.5LSB of K bit, which corresponds to a residue voltage of −62.5 mV to 187.5 mV when Vrefp is equal to 1 volt. To simplify the error correction mode of the SAR ADC 400, a predefined offset is added to the residue of the coarse ADC 422. This predefined offset, in one of the embodiments, can be introduced by adding a resistor tap in the coarse ADC 422 reference section. In an embodiment, the predefined offset is added to the residue of the coarse ADC 422 before the error correction mode. The predefined offset in the coarse ADC 422 provides that an additional capacitor is not used in the charge sharing DAC 410 as used in charge sharing DAC 310. Also, the predefined offset in the coarse ADC 422 provides that an adder/s and a subtractor/s are not used in the SAR state machine as used in the flowchart 200. In one of the embodiments, in a coarse ADC 422 of K-bit, the predefined offset added to the residue of the coarse ADC 422 is half LSB (least significant bit) of K bit, where K is an integer. Thus, when 0.5LSB predefined offset is added to the residue of the K-bit coarse ADC 422, the input voltage Vin 402 is resolved to K bit with a residue of −1LSB to 1LSB of K bit. The error correction mode in the SAR ADC further resolves the residue to 0LSB to 1LSB of K bit. This simplified approach seamlessly combines the coarse ADC 422 and the SAR ADC 400. The SAR ADC 400 does not use an additional capacitor as was used in SAR ADC 300 which is very difficult to integrate in the existing high accuracy SAR ADC designs. Also, the SAR ADC 400 does not use complex digital implementation which was illustrated in FIG. 2. Thus, the SAR ADC 400 provides ease of implementation without loss of accuracy and hence finds use in high speed applications.

The error occurring within the coarse ADC, in one embodiment, is corrected using multiple error correction cycles. The number of error correction cycles needed depends upon the error in the coarse ADC. The maximum error that can be corrected in one error correction cycle is 1 LSB (±0.5LSB). When the predefined offset of 0.5LSB is added to the residue of the K bit coarse ADC the input voltage Vin 402 is resolved to K bit with a residue of −1LSB to 1LSB of K bit i.e. maximum error of 1LSB is corrected. In an embodiment, when the predefined offset is 0.25LSB, an error of 0.5LSB is corrected.

In the foregoing discussion, the terms "connected" means at least either a direct electrical connection between the devices connected or an indirect connection through one or more passive intermediary devices. The term "circuit" means at least either a single component or a multiplicity of passive or active components, that are connected together to provide a desired function. The term "signal" means at least one current, voltage, charge, data, or other signal. Also, the terms "connected to" or "connected with" (and the like) are intended to describe either an indirect or direct electrical connection. Thus, if a first device is coupled to a second device, that connection can be through a direct electrical connection, or through an indirect electrical connection via other devices and connections.

It should be noted that reference throughout this specification to features, advantages, or similar language does not imply that all of the features and advantages should be or are in any single embodiment. Rather, language referring to the features and advantages is understood to mean that a specific feature, advantage, or characteristic described in connection with an embodiment is included in at least one embodiment of the present disclosure. Thus, discussion of the features and advantages, and similar language, throughout this specification may, but do not necessarily, refer to the same embodiment.

Further, the described features, advantages, and characteristics of the disclosure may be combined in any suitable manner in one or more embodiments. One skilled in the relevant art will recognize that the disclosure can be practiced without one or more of the specific features or advantages of a particular embodiment. In other instances, additional features and advantages may be recognized in certain embodiments that may not be present in all embodiments of the disclosure.

One having ordinary skill in the art will understand that the present disclosure, as discussed above, may be practiced with steps and/or operations in a different order, and/or with hardware elements in configurations which are different than those which are disclosed. Therefore, although the disclosure has been described based upon these preferred embodiments, it should be appreciated that certain modifications, variations, and alternative constructions are apparent and well within the spirit and scope of the disclosure. In order to determine the metes and bounds of the disclosure, therefore, reference should be made to the appended claims.

What is claimed is:

1. A successive approximation register analog to digital converter (SAR ADC), configured to receive an input voltage and a set of reference voltages, comprising:
a charge sharing DAC comprising an array of MSB (most significant bit) capacitors and an array of LSB (least significant bit) capacitors;
a zero crossing detector coupled to the charge sharing DAC, the zero crossing detector configured to generate a digital output;
a coarse ADC (analog to digital converter) configured to receive the input voltage and configured to generate a coarse output, wherein a predefined offset is added to a residue of the coarse ADC; and
a successive approximation register (SAR) state machine, coupled to the coarse ADC and the zero crossing detector and, configured to generate a plurality of control signals, wherein the plurality of control signals is configured to operate the charge sharing DAC in a sampling mode, an error-correction mode and a conversion mode.

2. The SAR ADC of claim 1 further comprising a plurality of switches configured to receive the input voltage and the set of reference voltages and, the charge sharing DAC (digital to analog converter) is coupled to the plurality of switches.

3. The SAR ADC of claim 1, wherein each switch of the plurality of switch is coupled to one or more capacitors in the array of MSB capacitors and the array of LSB capacitors.

4. The SAR ADC of claim 1, wherein each switch of the plurality of switch is configured to receive a control signal of the plurality of controls signals from the SAR state machine.

5. The SAR ADC of claim 1, wherein the set of reference voltages comprises a positive reference voltage and a negative reference voltage.

6. The SAR ADC of claim 1, wherein the coarse ADC is a K-bit coarse ADC and is configured to resolve the input voltage to K bit with a residue of −0.5LSB to 1.5LSB of K bit, where K is an integer.

7. The SAR ADC of claim 1, wherein the predefined offset added to the residue of the K-bit coarse ADC is half LSB (least significant bit) of K bit, where K is an integer.

8. The SAR ADC of claim 1, wherein during the sampling mode:
top plates of the array of MSB capacitors and the array of LSB capacitors are coupled to the zero crossing detector; and
bottom plates of the array of MSB capacitors and the array of LSB capacitors are coupled to the input voltage.

9. The SAR ADC of claim 1, wherein during the error-correction mode:
bottom plates of the array of LSB capacitors are coupled to the negative reference voltage;
bottom plates of a first set of capacitors of the array of MSB capacitors are coupled to the positive reference voltage by the plurality of control signals in response to the coarse output from the coarse ADC and bottom plates of remaining capacitors of the array of MSB capacitors are coupled to the negative reference voltage by the plurality of control signals in response to the coarse output from the coarse ADC;
the zero crossing detector is configured to compare the input voltage and a weighted voltage and to generate a digital output, wherein the weighted voltage is a voltage across the array of MSB capacitors and the array of LSB capacitors; and
the SAR state machine is configured to generate a plurality of control signals to couple the bottom plates of a second set of capacitors of the array of MSB capacitors to the positive reference voltage in response to the digital output and to couple the bottom plates of remaining capacitors of the array of MSB capacitors to the negative reference voltage in response to the digital output.

10. The SAR ADC of claim 1, wherein during the conversion mode:
the zero crossing detector is configured to compare the input voltage and the weighted voltage after the error correction mode; and
the SAR ADC is configured to perform a search and the search is terminated when the digital output is within a quantization error, wherein during the search:
the zero crossing detector is configured to compare the input voltage and the weighted voltage and to generate the digital output; and
the SAR state machine is configured to generate a plurality of control signals to couple the bottom plates of a set of capacitors of the array of LSB capacitors to the positive reference voltage in response to the digital output.

11. The SAR ADC of claim 1, wherein the predefined offset is added to the residue of the coarse ADC before the error correction mode such that an additional capacitor is not used in the charge sharing DAC and an adder and a subtractor are not used in the SAR state machine.

12. The SAR ADC of claim 1 is at least one of a single-ended SAR ADC and a differential SAR ADC.

13. A method of converting an input voltage to a digital output in a SAR ADC (successive approximation register analog to digital converter) comprising:
generating a coarse output in a coarse ADC (analog to digital converter) from the input voltage, wherein a predefined offset is added to a residue of the coarse ADC;
coupling an array of LSB capacitors to a negative reference voltage;
coupling a first set of capacitors of an array of MSB capacitors to a positive reference voltage in response to the coarse output and coupling remaining capacitors of the array of MSB capacitors to the negative reference voltage in response to the coarse output;
comparing the input voltage and a weighted voltage, wherein the weighted voltage is the voltage across the array of MSB capacitors and the array of LSB capacitors;
generating the digital output in response to the comparison of the input voltage and the weighted voltage;
generating a plurality of control signals to couple a second set of capacitors of the array of MSB capacitors to the positive reference voltage in response to the digital output and to couple remaining capacitors of the array of MSB capacitors to the negative reference voltage in response to the digital output.

14. The method of claim 13, wherein:
coupling the array of LSB capacitors to a negative reference voltage further comprises coupling bottom plates of the array of LSB capacitors to a negative reference voltage;
coupling the first set of capacitors of the array of MSB capacitors to the positive reference voltage in response to the coarse output and coupling remaining capacitors of the array of MSB capacitors to the negative reference voltage in response to the coarse output further comprises coupling bottom plates of the first set of capacitors of the array of MSB capacitors to the positive reference voltage and coupling bottom plates of the remaining capacitors of the array of MSB capacitors to the negative reference voltage in response to the coarse output; and
coupling the second set of capacitors of the array of MSB capacitors to the positive reference voltage and coupling remaining capacitors of the array of MSB capacitors to the negative reference voltage in response to the digital output further comprises coupling bottom plates of the second set of capacitors of the array of MSB capacitors to the positive reference voltage and coupling bottom plates of the remaining capacitors of the array of MSB capacitors to the negative reference voltage.

15. The method of claim 13 further comprising coupling top plates of the array of MSB capacitors and the array of LSB capacitor to a zero crossing detector.

16. The method of claim 13 further comprising coupling bottom plates of the array of MSB capacitors and the array of LSB capacitors to the input voltage before coupling the array of LSB capacitors to a negative reference voltage.

17. The method of claim 13 further comprising terminating a search when the digital output is within a quantization error, wherein the search comprises:
comparing the input voltage and the weighted voltage;
generating the digital output in response to the comparison of the input voltage and the weighted voltage; and
generating a plurality of control signals to couple a set of capacitors of the array of LSB capacitors to the positive reference voltage.

18. The method of claim 13, wherein the coarse ADC is a K-bit coarse ADC and is configured to resolve the input voltage to K bit with a residue of −0.5LSB to 1.5LSB of K bit, where K is an integer.

19. The method of claim 13, wherein the predefined offset added to the residue of the K-bit coarse ADC is half LSB (least significant bit) of K bit, where K is an integer.

20. The method of claim 13, wherein the SAR ADC is at least one of a single-ended SAR ADC and a differential SAR ADC.

* * * * *